(12) United States Patent  
Dimitrakopoulos et al.

(10) Patent No.: US 9,312,132 B2
(45) Date of Patent: Apr. 12, 2016

(54) METHOD OF FORMING HIGH-DENSITY ARRAYS OF NANOSTRUCTURES

(71) Applicant: INTERNATIONAL BUSINESS MACHINES CORPORATION, Armonk, NY (US)

(72) Inventors: Christos D. Dimitrakopoulos, Baldwin Place, NY (US); Jeehwan Kim, White Plains, NY (US); Hongsik Park, Yorktown Heights, NY (US); Byungha Shin, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/701,213

(22) Filed: Apr. 30, 2015

(65) Prior Publication Data

US 2015/0235849 A1    Aug. 20, 2015

Related U.S. Application Data

(63) Continuation of application No. 13/848,396, filed on Mar. 21, 2013, now Pat. No. 9,059,013.

(51) Int. Cl.
*H01L 29/06* (2006.01)
*H01L 21/02* (2006.01)
*H01L 21/304* (2006.01)

(52) U.S. Cl.
CPC .... *H01L 21/02664* (2013.01); *H01L 21/02527* (2013.01); *H01L 21/02529* (2013.01); *H01L 21/304* (2013.01); *Y10T 156/1082* (2015.01)

(58) Field of Classification Search
CPC . H01L 29/0669; H01L 29/0673; H01L 29/32; H01L 29/0665; H01L 29/127

USPC .......................................................... 438/458
See application file for complete search history.

(56) References Cited

U.S. PATENT DOCUMENTS

| 5,389,799 | A |   | 2/1995 | Uemoto |
| 6,071,795 | A | * | 6/2000 | Cheung ............... H01L 21/2007 |
|           |   |   |        | 257/E21.121 |

(Continued)

FOREIGN PATENT DOCUMENTS

| CN | 102637801 A  | 8/2012  |
| EP | 2267761 A2   | 12/2010 |

(Continued)

OTHER PUBLICATIONS

MVS Chandrashekhar, "Graphene by Solid-State Decomposition of SiC" Surfaces and Interfaces of Nanoscale Materials, May 23, 2011. (2 pages) Available at: http://mvschandra.wordpress.com/research/graphene-by-solid-state-decomposition-of-sic/.

(Continued)

*Primary Examiner* — Evan Pert
*Assistant Examiner* — Changhyun Yi
(74) *Attorney, Agent, or Firm* — Tutunjian & Bitetto, P.C.; Louis J. Percello (57) ABSTRACT

A method for forming nanostructures includes bonding a flexible substrate to a crystalline semiconductor layer having a two-dimensional material formed on a side opposite the flexible substrate. The crystalline semiconductor layer is stressed in a first direction to initiate first cracks in the crystalline semiconductor layer. The first cracks are propagated through the crystalline semiconductor layer and through the two-dimensional material. The stress of the crystalline semiconductor layer is released to provide parallel structures including the two-dimensional material on the crystalline semiconductor layer.

20 Claims, 5 Drawing Sheets

(56) References Cited

U.S. PATENT DOCUMENTS

| | | |
|---|---|---|
| 6,121,118 A | 9/2000 | Jin et al. |
| 6,830,990 B1 | 12/2004 | Honer et al. |
| 6,933,212 B1 | 8/2005 | Lee et al. |
| 7,014,710 B2 | 3/2006 | Fang et al. |
| 7,368,757 B2 | 5/2008 | Komiyama et al. |
| 7,595,543 B2 | 9/2009 | Weber et al. |
| 7,943,491 B2 | 5/2011 | Nuzzo et al. |
| 8,043,977 B2 | 10/2011 | Ohachi et al. |
| 8,076,717 B2 | 12/2011 | Sandhu et al. |
| 8,198,621 B2 | 6/2012 | Rogers et al. |
| 8,236,626 B2 | 8/2012 | Dai et al. |
| 8,242,030 B2 | 8/2012 | Hannon et al. |
| 2002/0031153 A1 | 3/2002 | Niwa et al. |
| 2008/0142075 A1 | 6/2008 | Reddy et al. |
| 2008/0305583 A1 | 12/2008 | Inada |
| 2009/0117741 A1 | 5/2009 | Heath et al. |
| 2010/0143726 A1 | 6/2010 | Golzhauser et al. |
| 2010/0200839 A1* | 8/2010 | Okai ............ C23C 16/26 257/29 |
| 2010/0200881 A1 | 8/2010 | Masaki |
| 2010/0320445 A1 | 12/2010 | Ogihara et al. |
| 2010/0323164 A1 | 12/2010 | Ogihara et al. |
| 2011/0048625 A1 | 3/2011 | Caldwell et al. |
| 2011/0108854 A1 | 5/2011 | Sung |
| 2011/0311722 A1 | 12/2011 | Faris |
| 2012/0086021 A1 | 4/2012 | Wang |
| 2012/0098024 A1 | 4/2012 | Hsu et al. |
| 2012/0141799 A1 | 6/2012 | Kub et al. |
| 2012/0148799 A1 | 6/2012 | Patolsky et al. |
| 2012/0175662 A1 | 7/2012 | Min et al. |
| 2012/0181507 A1 | 7/2012 | Dimitrakopoulos et al. |
| 2012/0197051 A1 | 8/2012 | Tour et al. |
| 2012/0211723 A1 | 8/2012 | Dimitrakopoulos et al. |
| 2012/0261643 A1 | 10/2012 | Cohen et al. |
| 2012/0261644 A1 | 10/2012 | Dimitrakopoulos et al. |

FOREIGN PATENT DOCUMENTS

| | | |
|---|---|---|
| JP | 07-302889 | 11/1995 |
| JP | 11-224856 | 8/1999 |
| JP | 2009200177 | 9/2009 |
| JP | 2011009268 A | 1/2011 |
| JP | 2011105590 A | 6/2011 |
| JP | 2012160711 | 8/2012 |
| WO | WO2012149257 A2 | 11/2012 |

OTHER PUBLICATIONS

Office Action mailed on Nov. 26, 2013 for U.S. Appl. 13/759,724. (17 pages).

Jaegermann, E., et al. "Cu and Ag Deposition on Layered P-Type WSE2: Approaching the Schottky Limit" Physical Review B, vol. 42, No. 12. Oct. 1990. pp. 7487-7496.

Li, C., et al. "Preparation of Single- and Few-Layer Graphene Sheets Using Co Deposition on SiC Substrate" Journal of Nanomaterials, vol. 2011. May 2011. pp. 1-7.

Li, Y., et al. "Progress Toward Nanowire Deivce Assembly Technology" "Nanowires" edited by P. Prete, Intech. Mar. 2010. pp. 373-394.

Loher, T., et al. "Highly Oriented Layers of the Three-Dimensional Semiconductor CDTE on the Two-Dimensional Layered Semiconductors MOTE2 and WSE2" Journal of Applied Physics. Nov. 1996. pp. 5718-5722.

Loher, T., et al. "Van Der Waals Epitaxy of Three-Dimensional CDS on the Two-Dimensional Layered Substrate MOTE2(0001)" Journal of Applied Physics. Aug. 1994. pp. 555-557.

Long, Y., et al. "Recent Advances in Large-Scale Assembly of Semiconducting Inorganic Nanowires and Nanofibers for Electronics, Sensors and Photovoltaics" Chem. Soc. Rev., vol. 41. Jul. 2012. pp. 4560-4580.

San Paulo, A., et al. "Suspended Mechanical Structures Based on Elastic Silicon Nanowire Arrays" Nano Letters, vol. 7, No. 4. Mar. 2007. pp. 1100-1104.

Tamboli, A., et al. "Wafer-Scale Growth of Silicon Microwire Arrays for Photovoltaics and Solar Fuel Generation" IEEE Journal of Photovoltaics, vol. 2, Issue 3. Jul. 2012. pp. 294-297.

Zhang, Y., et al. "Cutting Graphene Using an Atomic Force Microscope Based Nanorobot" Proceedings of 10th IEEE International Conference on Nanotechnology Joint Symposium with Nano Korea. Aug. 2010. pp. 639-644.

* cited by examiner

METHOD OF FORMING HIGH-DENSITY ARRAYS OF NANOSTRUCTURES

RELATED APPLICATION DATA

This application is a continuation of co-pending U.S. patent application Ser. No. 13/848,396 filed on Mar. 21, 2013, incorporated herein by reference in its entirety.

This application is related to commonly assigned application Ser. No. 13/670,921 filed on Nov. 7, 2012 and commonly assigned application Ser. No. 13/759,711 filed on Feb. 5, 2013, both incorporated herein by reference.

BACKGROUND

1. Technical Field

The present invention relates to semiconductor devices and fabrication, and more particularly to methods and devices having nanowires or nanoribbons formed by stress-induced crack propagation of two-dimensional materials, such as graphene.

2. Description of the Related Art

Nanowires are fabricated to increase surface area relative to volume in many applications, such as, in applications where absorption of radiation is of interest. Conventional methods for fabricating nanowires (NWs) may include different forms of lithography (e.g., E-beam lithography, photolithography, etc.). While effective, these processes are expensive and difficult to control, especially for sizes less than 20 nm. In addition to being cost-inefficient, lithography is extremely low throughput and prone to line-edge roughness, which results in a large scattering effect for carrier transport. Also, damage from dry etching processes leads to surface defects in the nanowires, poor electrical properties and low throughput.

Another process includes chemically derived materials for forming nanoribbons or nanowires. This type of growth suffers from many issues, e.g., it is difficult to control the density of the nanowires, and there is no alignment among the nanowires. In addition, the growth results in poor uniformity of material properties (dimensions (e.g., width)). The orientation of the nanowires is also very difficult to control.

SUMMARY

A method for forming nanostructures includes bonding a flexible substrate to a crystalline semiconductor layer having a two-dimensional material formed on a side opposite the flexible substrate. The crystalline semiconductor layer is stressed in a first direction to initiate first cracks in the crystalline semiconductor layer. The first cracks are propagated through the crystalline semiconductor layer and through the two-dimensional material. The stress of the crystalline semiconductor layer is released to provide parallel structures including the two-dimensional material on the crystalline semiconductor layer.

A method for forming nanostructures includes providing a monocrystalline semiconductor substrate; forming at least two monolayers of a two-dimensional material on the substrate; epitaxially growing a crystalline semiconductor layer over the two-dimensional material; bonding a flexible substrate to the crystalline semiconductor layer; separating the substrate from the crystalline semiconductor layer, which is bonded to the flexible substrate by splitting the two dimensional material; stressing the crystalline semiconductor layer in a first direction to initiate first cracks in the crystalline semiconductor layer; propagating the first cracks through the crystalline semiconductor layer and through the two-dimensional material; and releasing stress on the crystalline semiconductor layer to provide parallel structures including the two-dimensional material on the crystalline semiconductor layer.

A semiconductor device includes a flexible substrate and a crystalline semiconductor layer bonded to the flexible substrate, the crystalline semiconductor layer being cracked to form parallel structures along at least one direction. A two-dimensional material formed on the crystalline semiconductor layer having a thickness of one to ten monolayers, the two-dimensional material being separated at cracks in the crystalline semiconductor layer to form nanostructures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods for forming nanostructures (e.g., wires, ribbons, etc.) using a stress-inducing manipulation of semiconductor materials are provided. The term nanostructures will be employed throughout this disclosure to include nanowires, nanoribbons and nanodots. It should be understood that while the prefix nano will be employed to designate nano-sized dimensions, structures having sizes in the micron range (micro-sized) are also contemplated in accordance with the present principles.

In particularly useful embodiments, a two dimensional material, such as graphene, is applied to a substrate and flexed to produce micro cracks or splitting along crystal lines. The micro cracks are propagated through the materials to cause the two dimensional material to separate from other sections of the two dimensional material. By controlling the bending and therefore the stress longitudinally along the two dimensional material, fine lines of the material can be produced. The fine lines of the material form nanostructures along the substrate. These nanostructures may be employed in forming a plurality of different electrical/electronic structures. In one embodiment, a dielectric layer may be deposited to provide electrical isolation between the nanostructures. In other embodiments, the flexible substrate may be flexed in two orthogonal (or transverse) planes to cause the formation of islands or nanodots on the flexible substrate.

In another embodiment, temperature differences may be employed to form or propagate cracks; e.g., ultra low temperatures (e.g., cryogenic temperatures) or high temperatures may be employed to facilitate crack initiation and increase crack density.

It is to be understood that the present invention will be described in terms of a given illustrative architecture having a substrate or flexible substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The nanostructures (e.g., nanoribbons, nanowires and nano/quantum dots) embodiments as described herein may be employed in a plurality of applications and structures. For example, the present structures may be employed in devices to provide quasi one-dimensional effects (electron or photon confinement) (quantum dots) and/or provide a large ratio of surface area to volume. The nanowire/nanodot layer is less constrained as a substrate than for device fabrication compared to bulk or thin film materials and is suitable for flexible electronics and photonics designs. The present principles find utility in devices such as, tri-gate transistors, high-gain photodetectors, various sensors with high sensitivity, infra-red detectors using intersub-band transition, photo-emitters and lasers with extremely small footprints, nanogenerators for self-powered systems, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
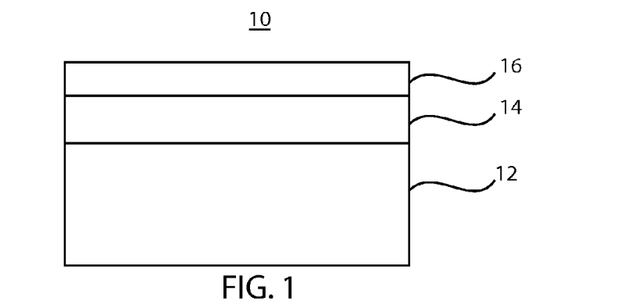
FIG. 1 is a cross-sectional view of a substrate having a spreading layer and a semiconductor layer formed thereon in accordance with the present principles.

Referring now to the drawings in which like numerals represent the same or similar elements and initially to FIG. 1, a structure 10 is illustratively shown for carrying out a lift-off process for formation of an electronic device in accordance with an exemplary embodiment. The structure 10 includes a single crystal substrate 12. In one embodiment, the single crystal substrate 12 includes SiC or alloys thereof. A two-dimensional material 14 forms a spreading or separation layer, which is formed on the substrate 12.

The two-dimensional (2D) material 14 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

While any substrate can be employed as the base substrate 12, the base substrate 12 should be capable of offering seed locations for single crystalline deposition (e.g., single crystalline graphene deposition). The 2D material 14 may be deposited (epitaxially grown) on the substrate 12. The spreading layer 14 may include graphene or other 2D materials, such as, e.g., $MoS_2$ or $WS_2$.

In one particularly useful embodiment, graphene is employed for 2D material 14 and may be formed by a thermal decomposition of the (0001) face of a SiC wafer (substrate 12). Si removal from the SiC surface results in the formation of graphene at the surface of SiC. In another embodiment, epitaxial carbon monolayer deposition may be employed to form graphene on the surface of the SiC substrate 12.

In one embodiment, graphene is formed by heating SiC substrates to temperatures greater than 1000 degrees C. resulting in Si evaporation out from the substrates leaving one or more monolayers of single crystalline carbon (graphene). Any single crystalline material whose lattice matches the SiC substrate (12), e.g., the graphene lattice matches well to SiC substrates, can be grown on top of graphene.

Epitaxial graphene can be grown on semi-insulating 4H- or 6H-(0001) SiC wafer surfaces within an induction-heated graphite susceptor located in an evacuatable chamber (e.g., a stainless steel vacuum chamber or quartz tube furnace) using a multistep process comprising surface preparation steps. For example, these steps may include annealing at 810° C. for 10 min and 1140° C. for 7 minutes under flow of 20% disilane in He, or annealing at a temperature around 1600° C. in $H_2$ gas. Then, a graphitization step is employed at 1450-1620 degrees C. under Ar flow at a chamber pressure from 3.5 mTorr to 900 mTorr for durations of 5 minutes to 2 hours. Other process parameters are also contemplated.

Graphene is atomically smooth and when applied to the substrate 12, a small thickness is desired. In one embodiment, the thickness of the graphene spreading layer 14 is preferably one monolayer, although 1-10 monolayers are acceptable. In useful embodiments, the number of monolayers of graphene may be determined depending on what is needed to cleanly separate the graphene to produce a wafer split (e.g., by spalling or other mechanical process) as will be described. Graphene is a "perfect" conductor, and thus assists in current spreading of hole (p-type carriers) injection. Therefore, a single monolayer may be desirable.

An epitaxially grown layer 16 may be formed on the spreading layer 14 (e.g., graphene). The layer 16 may include SiC, but other materials that lattice-match with the substrate 12 may be employed. It is a difficult task to form 3D materials (substrate lattices) on 2D materials as the 3D materials tend to form clusters on the 2D materials due to weak substrate overlayer interactions. In accordance with the present principles, considering that the lattice constant of SiC (a(SiC) =3.1 angstroms) is close but not the same as the lattice constant of free standing graphene (a(graphene)=2.5 angstroms), SiC has a lattice mismatch with free-standing graphene. However, if the graphene (14) is formed on a SiC substrate (12), this graphene is strained to have a same lattice constant as the SiC substrate. Therefore, SiC deposition on a graphene/SiC substrate can be provided without lattice mismatch.

In such cases, by matching the substrate 12 with a 2D material that complies with the substrate 12 on which it is grown, layer 16 can be grown to match the substrate 12 with less concern about the intervening 2D material (e.g., graphene). Layer 16 may include SiC, which can be deposited on SiC of substrate 12. This permits 3D materials to in effect be grown on 3D materials rather than 3D materials being grown on 2D materials. In other words, the lattice of the spreading layer 14 (graphene) is formed on the substrate 12 (SiC), which can offer a larger lattice for graphene so it can be better matched to optoelectronic or other semiconductor materials. In one embodiment, layer 16 forms a contact layer that is epitaxially grown on layer 14. Layer 16 is preferably thin, e.g., less than about 50 nm to provide flexibility.

Figure 2:
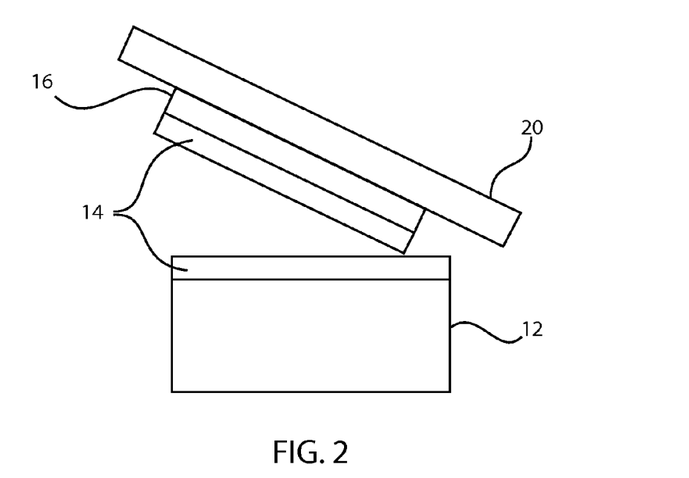
FIG. 2 is a cross-sectional view showing a flexible substrate bonded to the semiconductor layer and showing a split at the spreading layer in accordance with the present principles.

Referring to FIG. 2, a handle substrate 20 may be adhered to layer 16. Handle substrate 20 may include any suitable material and may include a flexible material. The handle or flexible substrate 20 may include a polymeric material(s), such as, e.g., thermoplastics, e.g., polyethylene terephthalate (PET), polyimide, etc.; reinforced epoxy resins, such as e.g., prepreg boards, etc. The flexible substrate 20 preferably includes elastic properties to permit full recovery during bending in accordance with the present principles. The layer 16 may be bonded to the flexible substrate 20 using an adhesive or the like. In other embodiments, additional layers may be employed between the flexible substrate 20 and the layer 16. The flexible substrate 20 and the layer 16 are formed or provided having determined thicknesses to assist in achieving desired bending stress/strain in the next steps.

Next, a cleaving process is employed to split or spread the spreading layer 14 to divide the single crystal substrate 12 from the layer 16. The single crystal substrate 12 is reusable for other steps or for growing additional layers for other devices. The cleaving process includes a layer splitting by mechanical force (e.g., spalling, smart-cut, etc.). In this way, layer 16 can be lifted off of substrate 12. By applying stress, spreading layer 14 is split leaving one or more monolayers of material (graphene) in contact with each of the substrate 12 and the layer 16. A portion of the thickness of the spreading layer 14 and the layer 16 are separated from the substrate 12.

Figure 3:
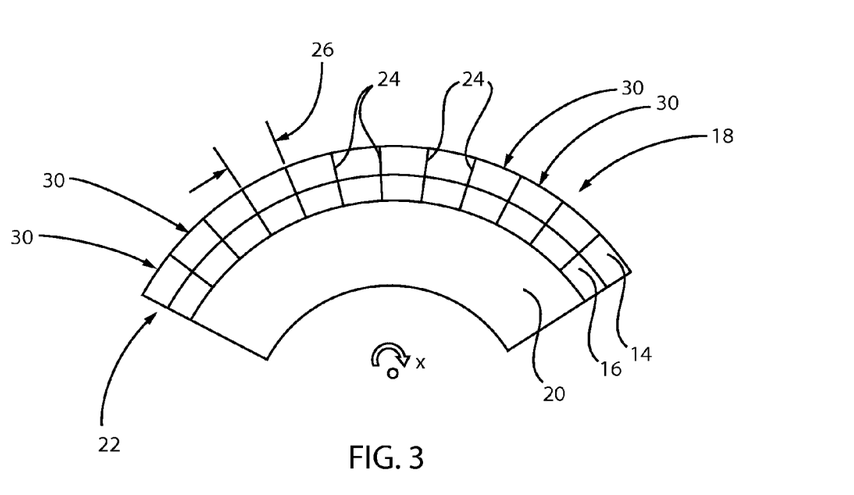
FIG. 3 is a cross-sectional view showing the flexible substrate stressed in bending to create and propagate cracks in the semiconductor layer and through the spreading layer in accordance with the present principles.

Referring to FIG. 3, a device stack 18, which includes the flexible substrate 20, the layer 16 and the spreading layer 14, is bent in a two point bending process. The two point bending flexes the device stack 18 about a single axis of rotation (e.g., the x-axis). This can be performed using a fixture or may include applying the device over a radiused surface. The bending radius and the thicknesses of the layers 20, 16 and 14 may be guided by beam theory computations to ensure sufficient strain is provided along crystal lines. In one embodiment, a machine chuck is employed to clamp two edges which can have a torque applied to cause bending.

In one embodiment, uniaxial tensile strain is induced to initiate and propagate cracking in layer 16, which is then transferred to a portion 22 of the spreading layer 14 on the flexible substrate 20. For example, cracking occurs along longitudinal lines or cleave planes in the layer 16 and propagates through the portion 22 to form cleavage planes or cracks 24 through the portion 22 (graphene). An intercrack distance 26 is proportional to the amount of tensile strain occurring in the bent stack 18. Cracks 24 in a nanoscale thick SiC film (e.g., layer 16) can be self-formed when tensile strain is high enough to form the cracks 24 with a nanometer scale intercrack distance 26. For the semiconductor layer 16, a thickness can be provided, e.g., between about 20 nm to about 900 nm, and a uniaxial strain can be computed such that the intercrack distance 26 provides a width dimension to form nanoribbons 30 by the bending. If the width dimension that is desired is to be close to the thickness dimension selected, a bending moment is selected to provide a uniaxial strain that will yield the desired intercrack distance 26 to achieve the width of the nanoribbons 30.

The uniaxial tensile strain is applied by two-point bending of the flexible substrate 20 until cracks located at the intercrack distance 26 propagate through the thickness of the semiconductor layer 16 and through the portion 22 (e.g., graphene) of the spreading layer 14. The crack propagation may be assisted by various mechanisms once cracks 24 are initiated. For example, cracks 24 may be accelerated by changing temperatures, employing vibration, increasing strain, etc.

In another embodiment, in addition to or instead of bending, the device stack 18 may be subjected to rapid temperature changes to cause expansion or contraction to induce or continue cracking. The temperature changes may be induced using, e.g., cryogenic cooling, flash heating or combinations thereof.

Figure 4A:
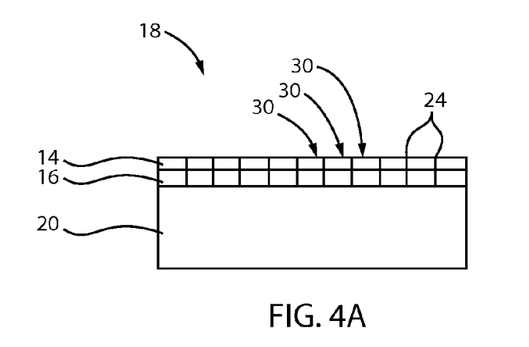
FIG. 4A is a cross-sectional view of the flexible substrate with parallel structures formed through and the spreading layer and having dielectric materials in accordance with the present principles.
Figure 4B:
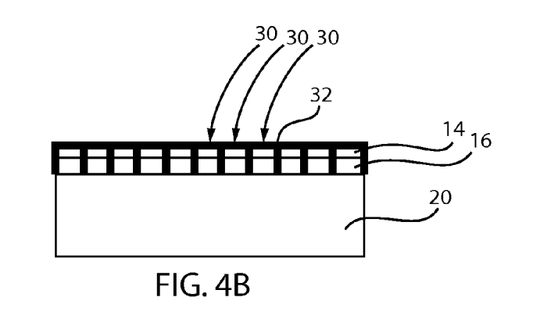
FIG. 4B is a cross-sectional view of the flexible substrate with dielectric materials formed over and in-between the parallel structures in accordance with the present principles.

Referring to FIG. 4A, a cross-sectional view of the device stack 18 is shown in accordance with one embodiment. After crack formation and propagation through the semiconductor layer 16 and through the spreading layer 14, stress/strain is released from the device stack 18. Depending on how the device stack 18 will be employed, a dielectric material 32 may optionally be deposited over the spreading layer 14 and/or the semiconductor layer 16 as shown in FIG. 4B. The dielectric material 32 may include, e.g., an oxide, such as silicon dioxide, a nitride, such as silicon nitride, silicon oxynitride, etc. A chemical vapor deposition or similar deposition process may be employed to form dielectric material 32.

In one embodiment, prior to forming the dielectric material 32, an etching process may be performed to increase the width of the cracks (24) between nanoribbons 30 to control their width and ensure the dielectric material 32 electrically isolates adjacent nanoribbons 30. The etching process may include a wet etch, using a diluted acid, e.g., HF, HCl, etc. In one embodiment, the flexible substrate 20 may be mounted permanently or temporarily on an additional rigid substrate (not shown) for stability during processing or operation.

Figure 4C:
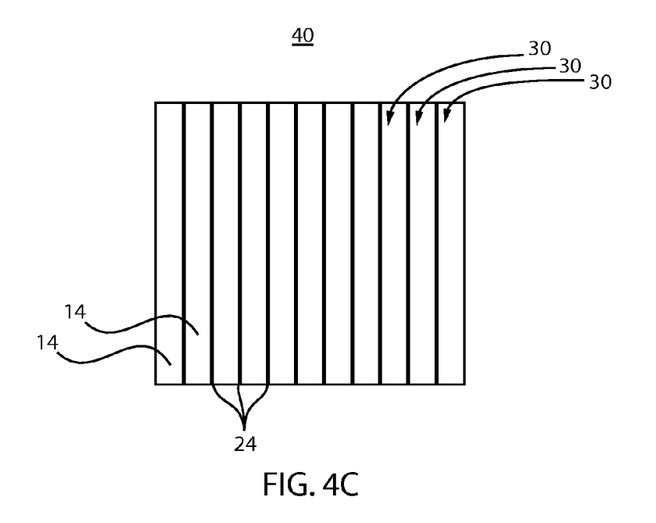
FIG. 4C is a top down view showing the flexible substrate with parallel structures formed in accordance with the present principles.

Referring to FIG. 4C, a top down view is shown for the structure in FIG. 4A without the dielectric material 32 on top to view the underlying nanoribbons 30. The nanoribbons 30 extend along an entire length of a device 40 in a crystal direction (of layer 16). In one embodiment, the graphene of the spreading layer 14 follows the cracks in the semiconductor layer 16 to form the nanoribbons 30.

It should be understood that the semiconductor layer 16 may be doped during formation or after formation either before or after crack inducement. It should also be understood that different portions of the semiconductor layer 16 may be doped differently depending on the specific applications of the nanoribbons 30. This may be achieved by forming masks on the surface of the semiconductor layer 16 and doping exposed areas. The dielectric material 32 may be formed after doping the semiconductor layer 16 or the nanoribbons 30.

Graphene layers are limited in many applications due to a lack of a band gap. Despite the excellent conductive properties of graphene, the lack of a band gap limits its use especially in complementary metal oxide semiconductor (CMOS) technology devices. In accordance with the present principles, the formation of nanoribbons 30 is a method for inducing a band gap in graphene. Quantum confinement is provided by forming graphene nanoribbons 30. The bandgap of a material can vary depending on the dimension of the material. For example, the apparent band gap can open up as the material becomes thin (i.e., 2D-shaped) or thin and narrow (i.e., 1D-shaped). A similar phenomenon occurs in the case of graphene nanostructures.

The cracks 24 cause separation between portions of the separation layer 14. For example, a graphene separation layer 14 may include one or more monolayers of graphene. As the underlying, semiconductor crystalline layer 16 cracks so too does the graphene separating layer 14 formed thereon.

Processing may continue and employ the nature of the nanoribbons 30 formed in accordance with the present principles. The nanoribbons 30 may be employed to form transistor devices, capacitors, electric wires, photosensitive devices, biosensors, wrap-around multi-channel transistors, etc. It should be understood that parts of the nanoribbons 30 may be etched away to create nanowires less than a full length of the device 40. In this way, nanoribbons 30 may be employed locally to form devices in isolation of other devices downstream along the same semiconductor crystal direction (e.g., 110).

Figure 5:
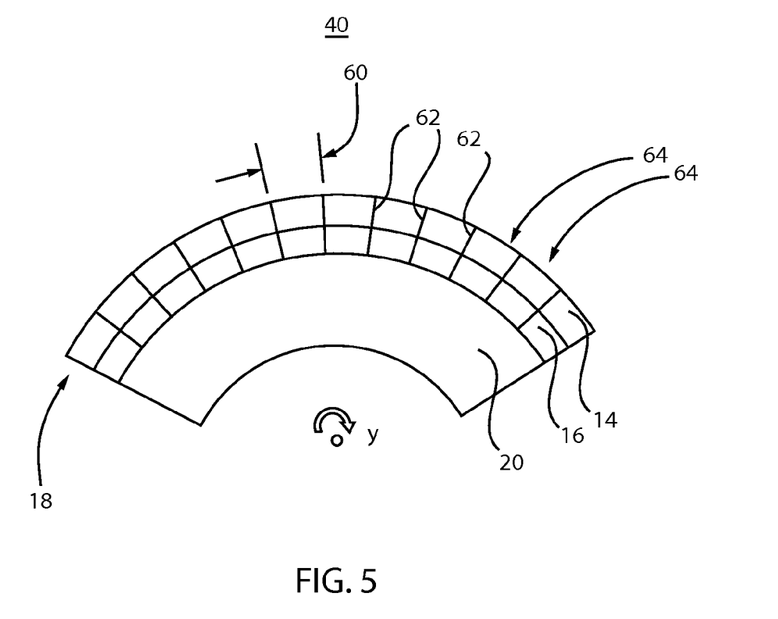
FIG. 5 is a cross-sectional view of the flexible substrate, semiconductor layer and spreading layer in bending along a second axis to create and propagate cracks in a second direction in accordance with the present principles.

Referring to FIG. 5, in one embodiment, further processing includes forming nanodots or quantum dots by performing an additional bending operation on the device 40. Prior to forming any dielectric material 32 (FIG. 4B), the device stack 18 is bent about a second axis of rotation in a second two point bending process similar to the process described with the respect to FIG. 3. If the axis of the first bending performed in FIG. 3 is arbitrarily considered the x-axis ("x"), the second axis will be designated as the y-axis ("y") and is orthogonal to the x-axis, although other angles may be employed. This bending can be performed using a fixture or may include applying the device 40 over a radiused surface. The bending radius and the thicknesses of the layers 14, 16 and 20 may be guided by beam theory computations to ensure sufficient strain is provided along crystal lines of layer 16. In one embodiment, the semiconductor layer 16 is positioned to have a crystal plane aligned to an axis of bending (e.g., plane 100).

In one embodiment, uniaxial tensile strain is induced to initiate and propagate cracking in the single crystalline semiconductor layer 16, as before. For example, cracking occurs along a cleavage plane, e.g., "100". An intercrack distance 60 is proportional to the amount of tensile strain occurring in the bent semiconductor layer 16. Cracks 62 in a nanoscale thick SiC film can be self-formed when tensile strain is high enough.

In one embodiment, the semiconductor layer 16 is positioned to have nanoribbons 30 cleaved along their length to form nanodots 64 with a cleave direction, e.g., a "001" or "010" crystal planes, aligned with an axis ("y") of bending.

In one embodiment, uniaxial tensile strain is induced to initiate and propagate cracking in the single crystalline semiconductor layer 16. For example, cracking occurs along a cleavage plane "001" or "010", if the original cleave plane (FIG. 3) is "110". Note that the cleave planes are orthogonal. Other transverse relationships between cleave planes may be provided and employed as needed. The intercrack distance 60 is proportional to the amount of tensile strain occurring in the bent semiconductor layer 16 in the second bending process. Cracks 62 in a nanoscale thick SiC film can be self-formed when tensile strain is high enough. For semiconductor layer 16, a thickness, width and length are now provided for nanodots or quantum dots 64. A uniaxial strain can be computed such that the intercrack distance 60 provides a third dimension (length) for nanodots 64 formed by the bending.

The uniaxial tensile strain may be applied by a four-point bending step where the bend axes (e.g., x and y) are applied concurrently on the flexible substrate 20 until cracks located at the intercrack distances 26 and 60 propagate through the thickness of the semiconductor layer 16. The crack propagation may be assisted by various mechanisms once cracks 24 and 60 are initiated. For example, cracks 24 and 60 may be accelerated by changing temperatures, employing vibration, increasing strain, etc.

The cracks 24 and/or 60 cause separation between portions of the separation layer 14. For example, a graphene separation layer 14 may include one or more monolayers of graphene. As the underlying, semiconductor crystalline layer 16 cracks so too does the graphene separating layer 14 formed thereon.

Figure 6:
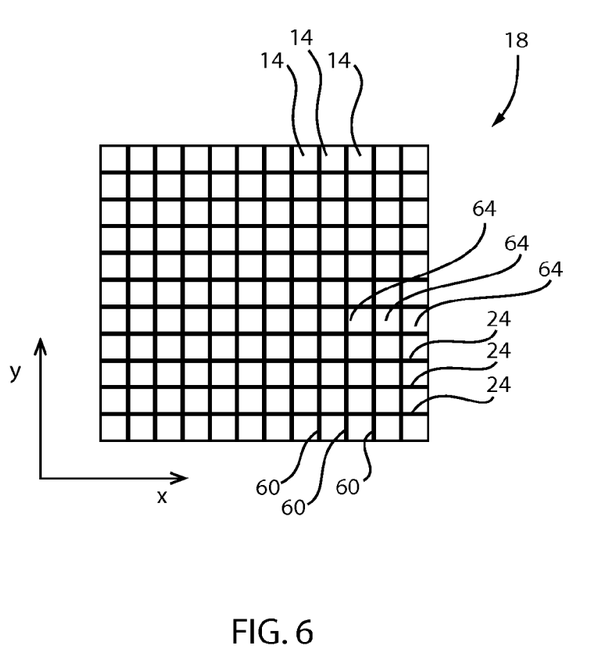
FIG. 6 is a top down view showing dot structures formed in the grid pattern in accordance with the present principles.

Referring to FIG. 6, after crack formation and propagation through the semiconductor layer 16 and through the spreading layer 14, stress/strain is released from the device stack 18. Depending on how the device stack 18 will be employed, the dielectric material 32 (not shown) may now optionally be deposited over the spreading layer 14 and/or the semiconductor layer 16. The dielectric material 32 may include, e.g., an oxide, such as silicon dioxide, a nitride, such as silicon nitride, silicon oxynitride, etc. A chemical vapor deposition or similar deposition process may be employed to form dielectric material 32.

In one embodiment, prior to forming the dielectric material 32, an etching process may be performed to increase the width of the cracks (24 and 60) between nanodots 64 to control their width and ensure the dielectric material 32 electrically isolates adjacent nanodots 64. The etching process may include a wet etch, using a diluted acid, e.g., HF, HCl, etc. In one embodiment, the flexible substrate 20 may be mounted permanently or temporarily on an additional rigid substrate (not shown) for stability during processing or operation.

Nanodots 64 include edges that extend along two different crystallographic directions. These different directions may be orthogonal but may include other configurations, e.g., two of the 100, 011, 010, 001, 011, etc. crystal directions may be employed. The nanodots 64 are high-density defect-free and aligned along the two crystal directions, and may be employed to form a quantum dot array, which may employ the semiconductor crystalline layer 16 and/or the separating layer 14 (graphene) for the formation of different device structures. The array may be employed in providing photonic crystals, an array of nano-scale photo-emitters or lasers, etc.

It should be understood that the semiconductor layer 16 may be doped during formation or after formation either before or after crack inducement. It should also be understood that different portions of the semiconductor layer 16 may be doped differently depending on the specific applications of the nanodots 64. This may be achieved by forming masks on the surface of the semiconductor layer 16 and doping exposed areas.

Processing may continue which employs the unique nature of the nanodots 64 formed in accordance with the present principles. The nanodots 64 may be employed to form quantum confinement structures, transistor devices, capacitors, photosensitive devices, biosensors, etc. It should be understood that the nanodots 64 may be etched away to create spaces between nanodots (e.g., a checkerboard pattern, etc.).

Figure 7A:
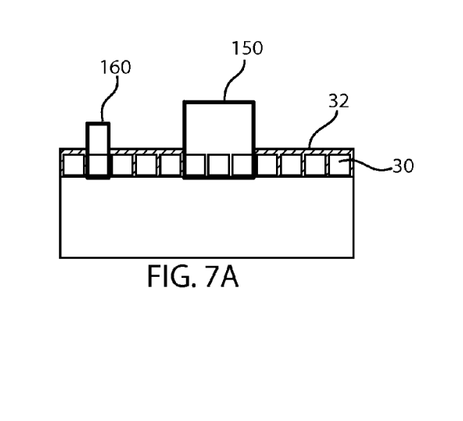
FIG. 7A is a cross-sectional view of the flexible substrate with parallel structures formed and having illustrative devices formed with the parallel structures in accordance with the present principles.
Figure 7B:
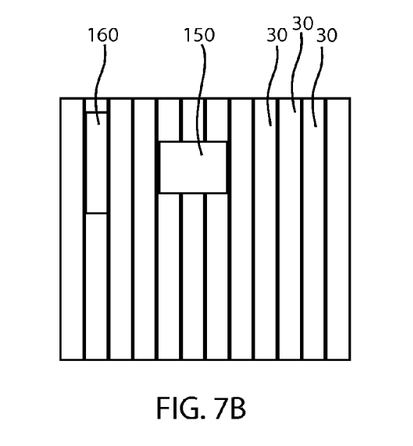
FIG. 7B is a top down view showing the flexible substrate with parallel structures formed and having the illustrative devices formed with the parallel structures in accordance with the present principles.

Referring to FIGS. 7A and 7B, illustrative devices are depicted in accordance with the present principles where FIG. 7A depicts a cross-sectional view, and FIG. 7B depicts a top view with dielectric material being transparent to view underlying materials. A device 150 is formed with multiple nanowires or nanoribbons 30 and may include a transistor device or the like. A longitudinal element 160 is formed over or with a single nanoribbon 30. This may include a capacitive element, a contact, a wire, etc.

Figure 8A:
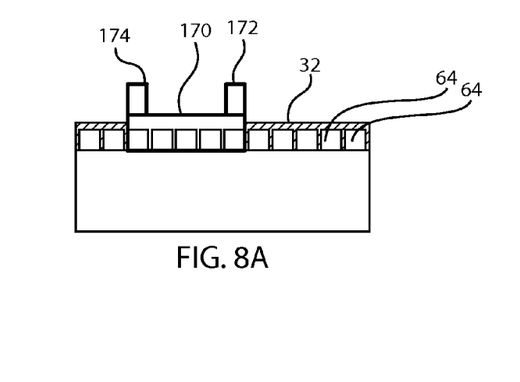
FIG. 8A is a cross-sectional view of the flexible substrate with dot structures formed and having illustrative devices formed with the dot structures in accordance with the present principles.
Figure 8B:
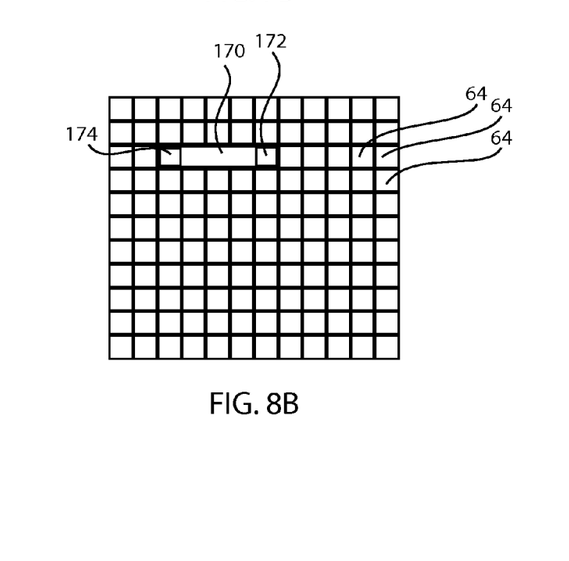
FIG. 8B is a top down view showing the flexible substrate with dot structures formed and having the illustrative devices formed with the dot structures in accordance with the present principles.

Referring to FIGS. 8A and 8B, illustrative devices are depicted in accordance with the present principles where FIG. 8A depicts a cross-sectional view and FIG. 8B depicts a top view with dielectric material being transparent to view underlying materials. A device 170 is formed with nanodots 64 and employs contacts 172 and 174 to connect to the device 170. Note that devices 150, 160 and 170 depict illustrative uses of the devices in accordance with the present principles. These devices 150, 160 and 170 should not be considered as limiting as other devices and structures are also contemplated.

Figure 9:
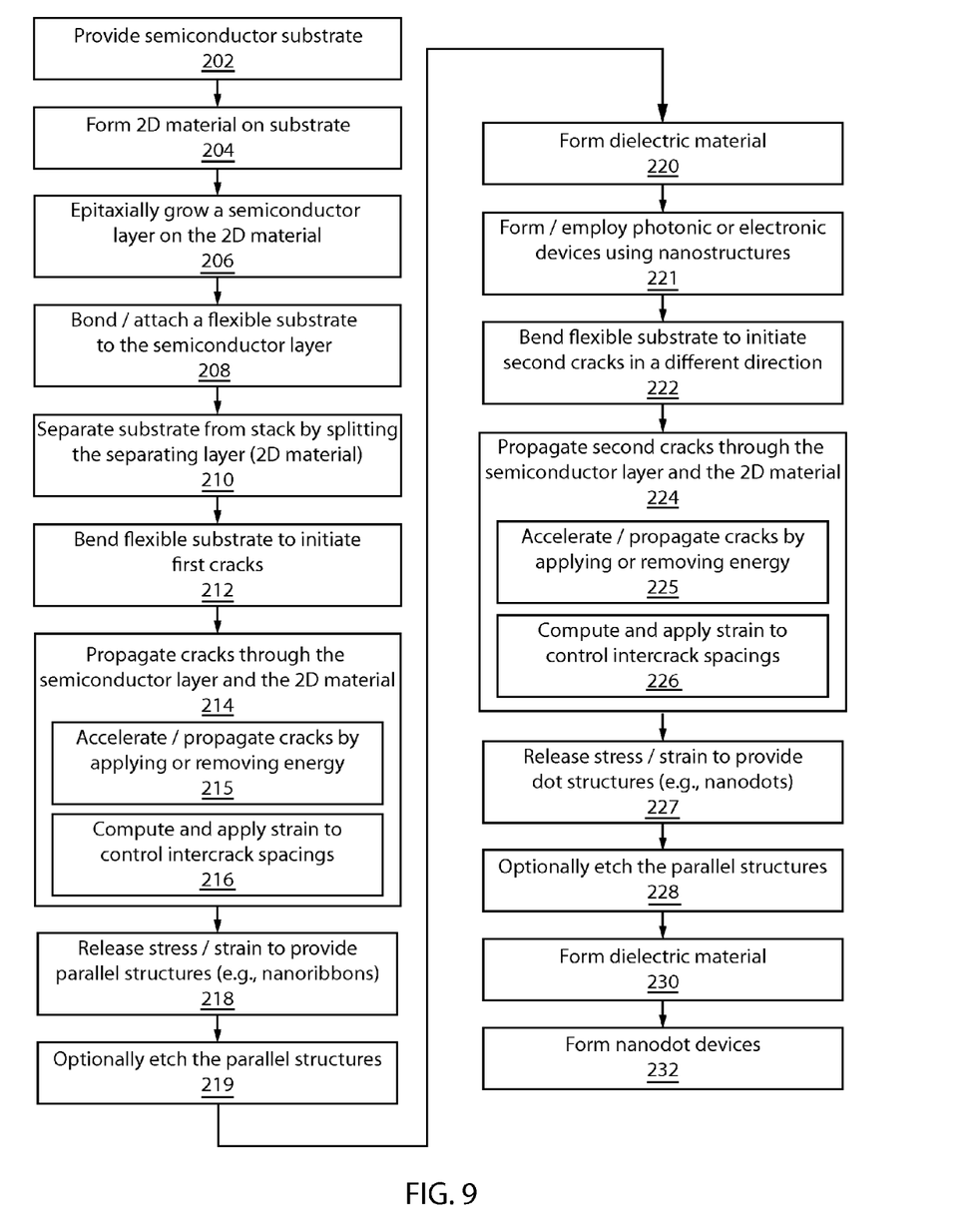
FIG. 9 is a block/flow diagram showing methods for forming nanostructures in accordance with illustrative embodiments.

Referring to FIG. 9, methods for forming nanostructures (e.g., ribbons, wires or dots) are illustratively shown in accordance with exemplary embodiments. It should be noted that, in some alternative implementations, the functions noted in the blocks may occur out of the order noted in the figure(s). For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. It should also be noted that groups of steps presented in FIG. 9 may be employed without other groups of steps in some embodiments. For example, nanodots may not be formed in one embodiment. In other embodiments, the flexible substrate may be bonded to the semiconductor layer, and a 2D material may be formed on the semiconductor layer without the need for the splitting process.

In block 202, a monocrystalline semiconductor substrate is provided. In block 204, at least two monolayers of a two-dimensional material are formed as a layer on the substrate. In block 206, a crystalline semiconductor layer is epitaxially grown over the two-dimensional material. The crystalline semiconductor layer is preferably lattice-matched to the substrate. In a particularly useful embodiment, the two-dimensional material includes graphene and the crystalline semiconductor layer includes SiC.

In block 208, a flexible substrate is bonded or otherwise attached to the crystalline semiconductor layer. In block 210, the substrate is separated from the crystalline semiconductor layer, which is bonded to the flexible substrate by splitting the two dimensional material. In other embodiment, a device stack including a flexible substrate, a crystalline semiconductor layer and a two-dimensional material may be provided by other methods.

In block 212, the crystalline semiconductor layer is stressed/strained in a first direction to initiate first cracks in the crystalline semiconductor layer. This may include bending the crystalline semiconductor layer using a two point bend or over a radiused surface. In block 214, the first cracks are propagated through the crystalline semiconductor layer and through the two-dimensional material. In block 215, one or more of a temperature change, vibration, increased stress may be applied (adding or removing energy) to propagate the cracks.

In block 216, the propagation of cracks includes computing a strain corresponding with an intercrack distance and applying the strain to provide a dimension for the parallel structures that is equal to the intercrack distance.

In block 218, stress/strain is released and the crystalline semiconductor layer and the two-dimensional material form parallel structures (e.g., nanoribbons or nanowires) on the flexible substrate. In block 218, an optional etch may be performed to increase the crack size. In block 220, a dielectric layer may be formed over the parallel structures. In block 221, an electronic or photonic device may be formed with the parallel structures. This may include doping or otherwise processing the parallel structures. Processing may stop after the devices are formed. However, in other embodiments, quantum dots may be desired and formed as follows (prior to forming the devices in block 220) using the parallel structures formed in block 218.

In block 222, the device with the parallel structures may be further processed by bending the crystalline semiconductor layer in accordance with a second direction to initiate second cracks transversely to the first cracks. In block 224, the second cracks are propagated through the crystalline semiconductor layer and through the two-dimensional material. In block 225, one or more of a temperature change, vibration, and increased stress may be applied to propagate the cracks. In block 226, strain may be applied as before to control intercrack spacings for the second cracks. In block 227, stress is released from the flexible substrate to provide dot structures including the two-dimensional material on the crystalline semiconductor layer. It should be understood that the bending in two dimensions may be performed concurrently. In block 228, an optional etch may be performed. In block 230 a dielectric layer may be formed. It should be understood that if nanodots are formed, the etch and dielectric layer formation of blocks 219 and 220 are omitted in favor of blocks 228 and 230. In block 232, processing continues to form devices using nanodots. It should be noted that in some embodiments, the parallel structures (e.g., nanoribbons) and dots (e.g., nanodots) may be employed together on a same chip/flexible substrate by performing partial bending on the substrate. Other configurations are also contemplated.

Having described preferred embodiments for self-formation of high-density arrays of nanostructures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming nanostructures, comprising:
   bonding a flexible substrate to a crystalline semiconductor layer having a two-dimensional material formed on a side opposite the flexible substrate;
   stressing the crystalline semiconductor layer in a first direction to initiate first cracks in the semiconductor layer;
   propagating the first cracks through the semiconductor layer and through the two-dimensional material; and
   releasing stress on the semiconductor layer to provide parallel structures including the two-dimensional material on the semiconductor layer.

2. The method as recited in claim 1, wherein the semiconductor layer comprises a crystalline semiconductor material.

3. The method of claim 1 further comprising forming the crystalline semiconductor layer on the two-dimensional material, wherein the two-dimensional material is directly present on a semiconductor substrate.

4. The method of claim 3 further comprising removing the semiconductor substrate after said bonding the flexible substrate to the semiconductor layer.

5. The method of claim 3, wherein the two dimensional material is carbon containing material.

6. The method of claim 3, wherein the semiconductor substrate is a monocrystalline substrate.

7. The method as recited in claim 1, wherein propagating cracks includes computing a strain corresponding with an intercrack distance and applying the strain to provide a dimension for the parallel structures that is equal to the intercrack distance.

8. The method as recited in claim 1, wherein the two-dimensional material includes graphene and the crystalline semiconductor layer includes SiC.

9. The method as recited in claim 1, further comprising:
   bending the crystalline semiconductor layer in accordance with a second direction to initiate second cracks transversely to the first cracks;
   propagating the second cracks through the crystalline semiconductor layer and through the two-dimensional material; and
   releasing stress on the crystalline semiconductor layer to provide dot structures including the two-dimensional material on the crystalline semiconductor layer.

10. The method as recited in claim 1, further comprising: forming an electronic or photonic device with the parallel structures.

11. The method as recited in claim 1, further comprising:
    providing a monocrystalline semiconductor substrate;
    forming at least two monolayers of a two-dimensional material on the substrate;
    epitaxially growing a crystalline semiconductor layer over the two-dimensional material; and
    separating the substrate from the crystalline semiconductor layer, which is bonded to the flexible substrate by splitting the two dimensional material.

12. The method as recited in claim 1, wherein stressing includes bending the the crystalline semiconductor layer using a two point bend or over a radiused surface.

13. The method as recited in claim 1, wherein propagating includes applying one or more of a temperature change, vibration, and increased stress.

14. A method for forming nanostructures, comprising:
    providing a monocrystalline semiconductor substrate;
    forming at least two monolayers of a two-dimensional material on the substrate;
    epitaxially growing a crystalline semiconductor layer over the two-dimensional material;
    bonding a flexible substrate to the crystalline semiconductor layer;
    separating the substrate from the crystalline semiconductor layer, which is bonded to the flexible substrate by splitting the two dimensional material;
    stressing the crystalline semiconductor layer in a first direction to initiate first cracks in the crystalline semiconductor layer;
    propagating the first cracks through the crystalline semiconductor layer and through the two-dimensional material; and
    releasing stress on the crystalline semiconductor layer to provide parallel structures including the two-dimensional material on the crystalline semiconductor layer.

15. The method as recited in claim 14, wherein propagating cracks includes computing a strain corresponding with an intercrack distance and applying the strain to provide a dimension for the parallel structures that is equal to the intercrack distance.

16. The method as recited in claim 14, wherein the two-dimensional material includes graphene and the crystalline semiconductor layer includes SiC.

17. The method as recited in claim 14, further comprising: forming an electronic or photonic device with the parallel structures.

18. The method as recited in claim 14, further comprising:
   bending the crystalline semiconductor layer in accordance with a second direction to initiate second cracks transversely to the first cracks;
   propagating the second cracks through the crystalline semiconductor layer and through the two-dimensional material; and
   releasing stress on the crystalline semiconductor layer to provide dot structures including the two-dimensional material on the crystalline semiconductor layer.

19. The method as recited in claim 14, wherein stressing includes bending the the crystalline semiconductor layer using a two point bend or over a radiused surface.

20. The method as recited in claim 14, wherein propagating includes applying one or more of a temperature change, vibration, and increased stress.

* * * * *